(12) United States Patent
Disney

(10) Patent No.: US 6,501,130 B2
(45) Date of Patent: Dec. 31, 2002

(54) HIGH-VOLTAGE TRANSISTOR WITH BURIED CONDUCTION LAYER

(75) Inventor: Donald Ray Disney, Cupertino, CA (US)

(73) Assignee: Power Integrations, Inc., San Jose, CA (US)

(*) Notice: Subject to any disclaimer, the term of this patent is extended or adjusted under 35 U.S.C. 154(b) by 0 days.

(21) Appl. No.: 10/176,345

(22) Filed: Jun. 20, 2002

(65) Prior Publication Data
US 2002/0149052 A1 Oct. 17, 2002

Related U.S. Application Data

(62) Division of application No. 09/769,649, filed on Jan. 24, 2001, now Pat. No. 6,424,007.

(51) Int. Cl.[7] ............................................. H01L 31/062
(52) U.S. Cl. ........................................ 257/342; 257/104
(58) Field of Search ................................. 257/341–346, 257/104, 372, 375, 376, 548–550; 438/301–306, 299, 180, 140, 188, 514, 995

(56) References Cited

U.S. PATENT DOCUMENTS

| | | | |
|---|---|---|---|
| 4,618,541 A | 10/1986 | Forouhi et al. | |
| 4,626,879 A | 12/1986 | Colak | |
| 4,665,426 A | 5/1987 | Allen et al. | |
| 4,754,310 A | 6/1988 | Coe | |
| 4,764,800 A | 8/1988 | Sander | |

(List continued on next page.)

FOREIGN PATENT DOCUMENTS

| | | |
|---|---|---|
| DE | 43 09 764 | 9/1994 |
| JP | 56-38867 | 4/1981 |
| JP | 57-10975 | 1/1982 |
| JP | 57-12557 | 1/1982 |
| JP | 57-12558 | 1/1982 |
| JP | 60-64471 | 4/1985 |
| JP | 3-211771 | 9/1991 |
| JP | 4107877 A | 4/1992 |
| JP | 6-224426 | 8/1994 |
| WO | WO 99/34449 | 7/1999 |

OTHER PUBLICATIONS

*International Electron Devices Meeting 1979–Washington, D.C.* Dec. 3–4–5, Sponsored by Electron Devices Society of IEEE, pp. 238–241.

*Realization of High Breakdown Voltage (>700 V) in Thin SOI Devices*; S. Merchant, E. Arnold, H. Baumgart, S. Mukherjee, H. Pein, and R. Pinker, Philips Laboratories, North American Philips Corporation; 1991 IEEE, pp. 31–35.

Patent Abstract of Japan, vol. 016, No. 347 (E–1240), Jul. 27, 1992 and JP 04 107867 (Matsushita Electron Corp.) Apr. 9, 1992.

Patent Abstract of Japan, vol. 018, No. 590 (E–1628), Nov. 10, 1994 and JP 06224426 (Matsushita Electron Corp.) Aug. 12, 1994.

(List continued on next page.)

*Primary Examiner*—David Nelms
*Assistant Examiner*—Long K. Tran
(74) *Attorney, Agent, or Firm*—Burgess & Bereznak, LLP

(57) ABSTRACT

A lateral, high-voltage, FET having a low on-resistance and a buried conduction layer comprises a P-type buried layer region within an N-well formed in a P-type substrate. The P-type buried layer region is connected to a drain electrode by a first P-type drain diffusion region that is disposed in the N-well region. The P-type buried layer region is also connected to a second P-type drain diffusion region that extends down from the surface at one end of the PMOS gate region. A P-type source diffusion region, which connects to the source electrode, defines the other end of the gate region.

13 Claims, 3 Drawing Sheets

U.S. PATENT DOCUMENTS

| | | |
|---|---|---|
| 4,811,075 A | 3/1989 | Elkund |
| 4,890,146 A | 12/1989 | Williams et al. |
| 4,922,327 A | 5/1990 | Mena et al. |
| 4,926,074 A | 5/1990 | Singer et al. |
| 4,939,566 A | 7/1990 | Singer et al. |
| 4,963,951 A | 10/1990 | Adler et al. |
| 4,967,246 A | 10/1990 | Tanaka |
| 5,010,024 A | 4/1991 | Allen et al. |
| 5,025,296 A | 6/1991 | Fullerton et al. |
| 5,040,045 A | 8/1991 | McArthur et al. |
| 5,068,700 A | 11/1991 | Yamaguchi et al. |
| 5,146,298 A | 9/1992 | Elkund |
| 5,155,574 A | 10/1992 | Yamaguchi |
| 5,237,193 A | 8/1993 | Williams et al. |
| 5,258,636 A | 11/1993 | Rumennik et al. |
| 5,270,264 A | 12/1993 | Andideh et al. |
| 5,313,082 A | 5/1994 | Eklund |
| 5,324,683 A | 6/1994 | Fitch et al. |
| 5,349,225 A | 9/1994 | Redwine et al. |
| 5,359,221 A | 10/1994 | Miyamoto et al. |
| 5,386,136 A | 1/1995 | Williams et al. |
| 5,438,215 A | 8/1995 | Tihanyi |
| 5,521,105 A | 5/1996 | Hsu et al. |
| 5,550,405 A | 8/1996 | Chueng et al. |
| 5,637,898 A | 6/1997 | Baliga |
| 5,654,206 A | 8/1997 | Merrill |
| 5,656,543 A | 8/1997 | Chung |
| 5,659,201 A | 8/1997 | Wollesen |
| 5,663,599 A | 9/1997 | Lur |
| 5,670,828 A | 9/1997 | Cheung et al. |
| 5,679,608 A | 10/1997 | Cheung et al. |
| 5,716,887 A | 2/1998 | Kim |
| 5,894,154 A | 4/1999 | Shibib |
| 5,943,595 A | 8/1999 | Akiyama et al. |
| 5,998,833 A | 12/1999 | Baliga |
| 6,010,926 A | 1/2000 | Rho et al. |
| 6,168,983 B1 | 1/2001 | Rumennik et al. |
| 6,184,555 B1 | 2/2001 | Tihanyi et al. |
| 6,207,994 B1 | 3/2001 | Rumennik et al. |

OTHER PUBLICATIONS

Fujihira, "Theory of Semiconductor Superjunction Devices," Jpn. J. Appl. Phys., vol. 36, pp. 6254–6262 (Oct. 1997).

*Air–Gap Formation During IMD Deposition to Lower Interconnect Capacitance*, B. Shieh, K.C. Saraswat, IEEE Electron Device Letters, vol., 19, No. 1, Jan. 1998.

*Theory of Semiconductor Superjunction Devices*, Tatsuhiko Fujihara; Received Mar. 11, 1997; accepted for publication Jul. 23, 1997, 9 pages.

Yung C. Liang, K.P. Gan and Ganesh S. Sumudra; Oxide–Bypassed VDMOS (OBVDMOS): An Alternative to Super-junction Hgh Voltage MOS Power Devices; Article dated Aug. 8, 2001, IEEE Electron Devices Letters, vol. 22, No. 8, pp. 407–409.

*Comparison of High Voltage Devices for Power Integrated Circuites*, R. Jayaraman., V. Rumennik, B. Singer, E.H. Stupp, IEDM 84, pp. 258–261.

*A New Generation of High Voltage MOSFETs Breaks The Limit Line of Silicon*, G. Deboy, M. Marz, J.–P. Stengl, H. Strack, J. Tihanyi and H. Weber, Siemens AG, Semiconductor Division, Munchen, Germany; IEDM 98—683–IEDM 98–685.

*High Performance 600 V Smart Power Technology Based on Thin Layer Silicon–on–Insulator*; T. Letavic, E. Arnold, M. Simpson, Philips Research, Philips Electronics North America Corporation, 4 pages.

*Modeling and Optimization of Lateral High Voltage IC Devices to Minimize 3–D Effects*, Hamza Yilmaz, R&D Engineering, Semiconductor Business Division, General Electric Company, NC, pp. 290–294.

HIGH-VOLTAGE TRANSISTOR WITH BURIED CONDUCTION LAYER

RELATED APPLICATION

This application is related to U.S. patent application Ser. No. 09/245,029, filed Feb. 5, 1999, of Rumennik et al., which application is assigned to the assignee of the present application and is herein incorporated by reference.

FIELD OF THE INVENTION

The present invention relates to semiconductor devices. More specifically, the present invention relates to high voltage field-effect transistor structures fabricated in silicon substrates.

BACKGROUND OF THE INVENTION

Lateral, high-voltage, field-effect transistors (HVFETs) have been fabricated using an insulated gate field-effect transistor (IGFET) placed in series with a high-voltage junction field-effect transistor (JFET). The IGFET is used to control the "on" state current in the device and the JFET is used to support high-voltage in the "off" state. This HVFET structure can be switched at high voltages, has a low on-state resistance, and has insulated-gate control. In addition, it may advantageously be fabricated near low voltage logic transistors on a single integrated circuit chip.

Lateral HVFETs are commonly fabricated in accordance with the Reduced Surface Field (RESURF) principle. The RESURF principle, however, mandates that the charge in the extended drain region, which serves as the channel of a lateral JFET, be carefully controlled to obtain high breakdown voltage. To keep the maximum electric field below the critical field at which avalanche breakdown occurs the amount of charge in the JFET channel is typically limited to a maximum of about $1 \times 10^{12}$ cm$^{-2}$. When the HVFET is in the "on" state, the resistance of the JFET channel constitutes a large portion of the on-state resistance of the HVFET. Therefore, the limitation on the maximum charge in the JFET channel also sets the minimum specific on-resistance of the device.

A HVFET having an extended drain region with a top layer of a conductivity type opposite that of the extended drain region is disclosed in U.S. Pat. No. 4,811,075. The '075 patent teaches that the top layer nearly doubles the charge in the conducting layer, with a commensurate reduction in device on-resistance. This top layer also helps to deplete the JFET conduction region when the extended drain is supporting a high voltage.

Further extending this concept, U.S. Pat. No. 5,411,901 teaches utilizing the opposite conductivity type top layer as the conducting portion of the JFET in a complementary high-voltage transistor. One drawback, however, is that construction of this complementary device requires additional processing steps to achieve high-voltage capability. Additionally, the on-resistance of the complementary device is limited by the charge requirement for the top region (e.g., about $1 \times 10^{12}$ cm$^{-2}$). Another difficulty is that the top layer is often formed prior to oxidation of the silicon surface, which introduces additional process variation.

To further increase the total charge in the conducting region of the JFET and reduce on-resistance, U.S. Pat. No. 5,313,082 teaches a HVFET structure In which two JFET channels are arranged in parallel. A triple diffusion process is disclosed, in which three separate implant and diffusion steps are required to form a HVFET having an N-type conducting top layer, a P-type middle layer, and an N-type conducting bottom layer. The multiple layers of alternating conductivity types are fabricated by implanting, and then diffusing, dopants into the semiconductor substrate. The '082 patent also describes a complementary high-voltage transistor (i.e., a P-channel device) that is formed by adding an additional layer to the three-layer extended drift region.

One shortcoming of this prior art approach is that each successive layer is required to have a surface concentration that is higher than the preceding layer, in order to fully compensate and change the conductivity type of the corresponding region. Diffusion of dopants from the surface makes it very difficult to maintain adequate charge balance among the layers. In addition, the heavily doped P-N junction between the buried layer and drain diffusion region degrades the breakdown voltage of the device. The concentrations also tend to degrade the mobility of free carriers in each layer, thereby compromising the on-resistance of the HVFET. The additional layer required for making the complementary device also complicates the manufacturing process.

A p-channel MOS device design that is compatible with a generic process for manufacturing complementary CMOS devices is disclosed in U.S. Pat. No. 5,894,154.

DESCRIPTION OF THE DRAWINGS

The present invention is illustrated by way of example, and not limitation, in the figures of the accompanying drawings, wherein.

DETAILED DESCRIPTION

A high-voltage field-effect transistor is described. The HVFET has a low specific on-state resistance, and can be easily integrated with a complementary lateral HVFET on the same chip along with low voltage logic devices. In the following description, numerous specific details are set forth, such as material types, doping levels, structural features, processing steps, etc., in order to provide a thorough understanding of the present invention. Practitioners having ordinary skill in the semiconductor arts will understand that the invention may be practiced without many of these details. In other instances, well-known elements, techniques, and processing steps have not been described in detail to avoid obscuring the invention.

Figure 1:
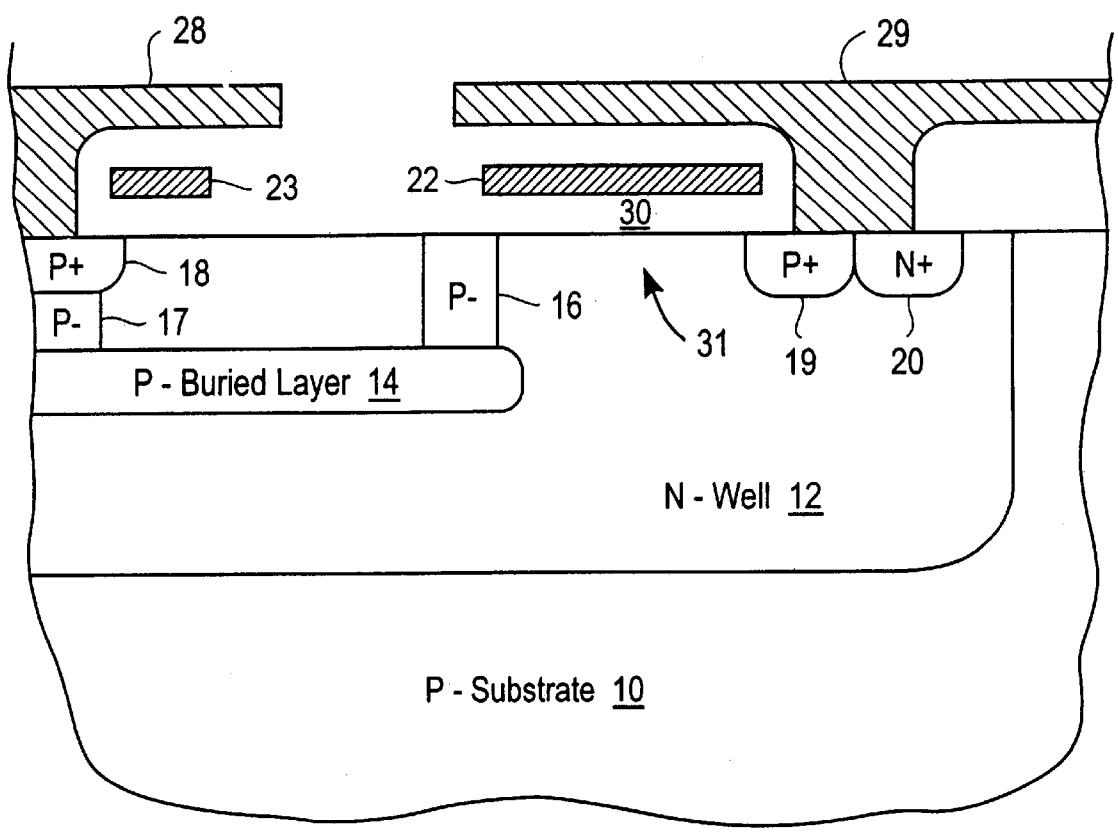
FIG. 1 is a cross-sectional side view of one embodiment of a high-voltage, field-effect transistor (HVFET) device structure in accordance with the present invention.

FIG. 1 is a cross-sectional side view of a p-channel HVFET device structure in accordance with one embodiment of the present invention. (It should also be understood that the elements in the figures are representational, and are not drawn to scale in the interest of clarity.) An N-channel transistor may be realized by utilizing the opposite conductivity types for all of the illustrated diffusion regions. The device of FIG. 1 includes an insulated-gate, field-effect transistor (IGFET) having a gate 22 (comprised, for example, of polysilicon), an gate insulating layer 30, comprised of silicon dioxide or another appropriate dielectric insulating material, and an underlying N-type well region 12 disposed in a lightly-doped P-type substrate region 10. The area of n-type well region 12 directly beneath gate 22 comprises the IGFET channel region 31 of the transistor. In this embodiment, the gate region is a metal-oxide semiconductor (MOS), and the IGFET is a PMOS transistor.

Channel region 31 is defined at one end by P+ source diffusion region 19 and at the other end by P-type diffusion region 16, which extends down from the substrate surface of N-well 12. A lateral high-voltage p-channel FET is formed by the series connection of the PMOS device and a P-type JFET transistor formed by high-energy implantation of a P-type dopant (e.g., boron) into N-well region 12. This high-energy implantation forms P-type buried layer 14, which is connected to and p-type diffusion region 16. Buried layer 14 comprises the conducting portion of the extended drain of the P-type JFET device. The charge In P-type buried region 14 is approximately $2 \times 10^{12}$ cm$^{-2}$ in this embodiment, resulting in an on-resistance that is about 50% lower that traditional devices.

Practitioners in the art will appreciate that the doping in P-type diffusion region 16 is chosen so that this region can be fully depleted at a relatively low voltage (<100V) in the off state. This insures that region 16 does not interfere with the ability of the transistor to support high voltage (~700V) in the off state.

A source electrode 29 provides an electrical connection to P+ source diffusion region 19. Similarly, a drain electrode 28 connects to a P+ drain diffusion region 18. Drain diffusion region 18 and source diffusion region 19 may be formed using the same implant steps. Electrical connection between drain diffusion region 18 and buried layer 14 is established via P-type diffusion region 17. It is understood that region 17 may be formed simultaneous with P-type diffusion region 16 using the same processing steps. Alternatively, P+ drain diffusion region 18 may be formed to extend vertically from the substrate surface down to P-type buried layer 14.

Respective source and drain electrodes 29 and 28 may comprise a number of widely used metals or metal alloys. Note that source electrode 29 is shown extending over, and Insulated from, gate 22 where it functions as a field plate. Similarly, drain electrode 28 extends over polysilicon field plate member 23, disposed above and adjacent to drain diffusion region 18. Field plating acts to reduce the surface electric field and increase the effective radius for depletion of the substrate, thereby increasing the breakdown voltage of the transistor. In the embodiment of FIG. 1, a N+ diffusion region 20 is disposed adjacent to P+ source diffusion region 19. Diffusion region 20 provides good electrical connection to N-well region 12 and thus reduces susceptibility of the device to parasitic bipolar effects.

When the P-channel HVFET of FIG. 1 is in the on-state, current flows from the source diffusion region 19 through the IGFET channel region 31 and then through P-type regions 16, 14, and 17 to P+ drain diffusion region 18. As discussed above, the charge in P-type buried region 14 is approximately twice as high than that of a conventional P-channel device. Thus, the resistance of the extended drain region is reduced to about ½ that of a conventional device.

In the off state, P-diffusion region 16, P-type buried layer region 14, and N-well region 12 are mutually depleted of free carriers.

An important advantage of the device structure shown in FIG. 1 is that it can be constructed using the same process used to fabricate a complementary, high-voltage, N-channel FET. For instance, such a process is set forth in FIGS. 11a–11i and the associated description of the incorporated Rumennik et al. patent application. Significantly, no additional processing complexity is introduced since the same masking layers may be used for both devices, other than the addition of P-type region 16.

In accordance with the aforementioned process for fabricating an N-channel HVFET, building a complementary device on the same silicon substrate can be accomplished by segregating the respective N-well regions associated with the P-channel and N-channel devices. The masking layer used to form P-type buried layer region 14 of the P-channel device can be used to simultaneously form the buried layer region of the N-channel device structure. In the N-channel device, this P-type buried layer divides the single conductive N-well into parallel conductive drift of the JFET transistor. Added in parallel, each conductive region reduces the on-resistance of the HVFET structure.

Figure 3:
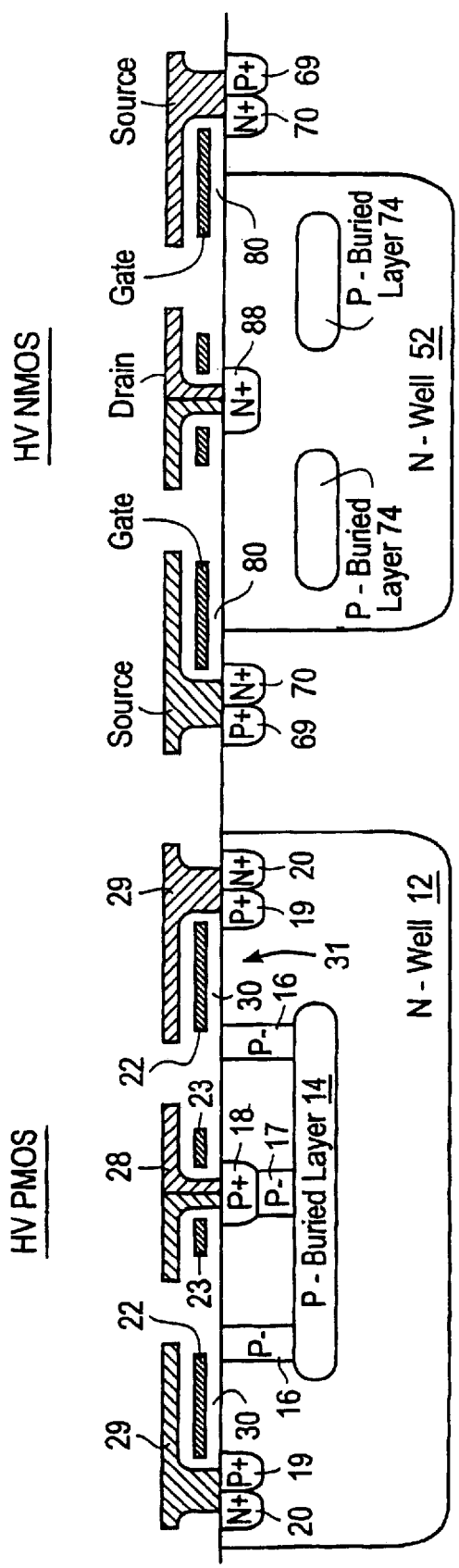
FIG. 3 is a cross-sectional side view of complementary HVFETs fabricated on the same substrate in accordance with the present invention.

By way of example, FIG. 3 illustrates high-voltage PMOS and NMOS transistors fabricated adjacent to one another on the same P-type substrate 10. Note that the same processing steps used to form N-well 12 of the PMOS device may also be used to fabricate N-Well 52 of the NMOS device. Similarly, buried layer 14 of the PMOS device and buried layer 74 of the NMOS device may be formed using the same steps. Other regions of the PMOS and NMOS devices that can be formed with the same processing steps include P+ regions 19 and 69, N+ regions 20 and 70, and gate oxide regions 30 and 80, respectively.

P-type diffusion region 16 of FIG. 1, for example, may be formed either before or after the implantation step that forms the P-type buried layer regions of the N-channel and P-channel devices. By way of example, diffusion region 16 may be formed by implantation of boron into the substrate following formation of N-well 12. If the process optionally includes steps for forming a field oxide layer, P-type diffusion region 16 may be formed in N-well 12 either prior to field oxide growth, or afterward, utilizing conventional processing techniques.

Figure 2:
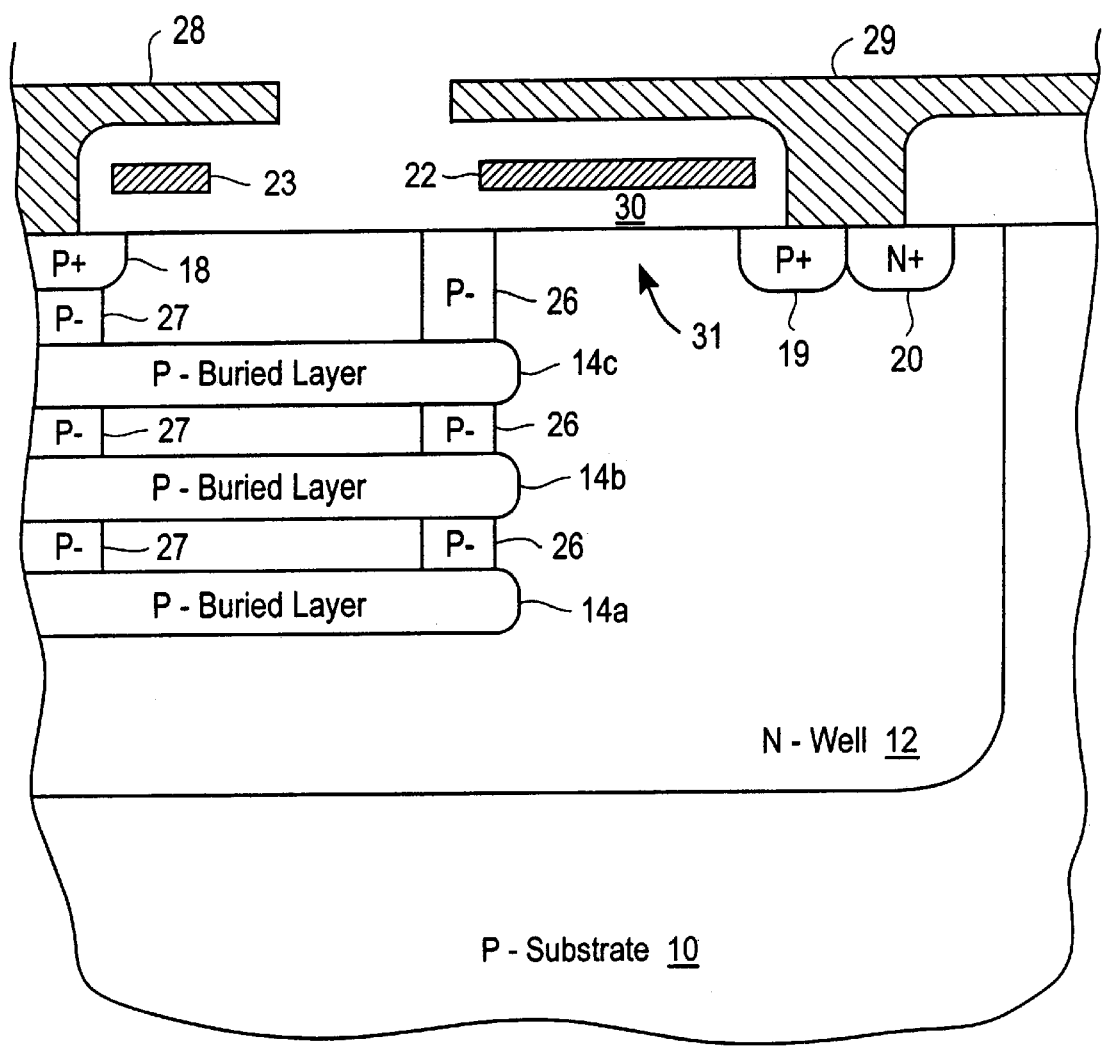
FIG. 2 is a cross-sectional side view of another embodiment of a HVFET fabricated in accordance with the present invention.

FIG. 2 illustrates an alternative embodiment of the present invention, which comprises a plurality of vertically stacked P-type buried layer regions 14a–14c disposed in N-well region 12. In a typical processing sequence, a single implant mask is used to define all of the buried layers. High-energy implantation is then used to form buried layer region 14a, 14b, and 14c. The device structure of FIG. 2 includes a P-type diffusion region 26, which defines one end of channel 31. Diffusion region 26 extends down from the substrate surface to electrically connect with each of buried layer regions 14a–14c. Similarly, P-type diffusion region 27 extends vertically down from P+ drain diffusion region 18 to connect with each of buried layer regions 14a–14c. Instead of forming a separate P-type region 27, the connection to each of buried layer regions 14 beneath drain diffusion region 18 may be achieved by simply extending P+ drain diffusion region 18 vertically down from the substrate surface to a depth sufficient to connect with buried layer regions 14a–14c.

Thus, the spaced-apart P-type buried layer regions 14 in the HVFET of FIG. 2 provide parallel conduction paths. By controlling the charge in each of the buried layer regions 14 the ability of the P-channel device to support high voltage in not compromised. Moreover, in accordance with the above teachings, each additional conducting layer contributes an additional $2 \times 10^{12}$ cm$^{-2}$ of charge to further lower the on-resistance of the device.

I claim:

1. A complementary device that includes first and second high-voltage field-effect transistors (HVFETs) fabricated on a substrate of a first conductivity type, comprising:

first and second well regions of a second conductivity type, opposite to the first conductivity type, disposed in the substrate, the first well region being spaced-apart from the second well region, the first and second well regions being associated with the first and second HVFETs, respectively;

the first HVFET further comprising:
  a first source diffusion region of the first conductivity type disposed in the first well region;
  a first drain diffusion region of the first conductivity type disposed in the first well region spaced-apart from the first source diffusion region, a first channel region being defined in the first well region between the first source diffusion region and the first drain diffusion region;
  a second drain diffusion region of the first conductivity type disposed in the first well region spaced-apart from the first drain diffusion region;
  a first buried layer region of the first conductivity type disposed within the first well region, the first buried layer region being connected to both the first and second drain diffusion regions;
  a first insulated gate formed over the first channel region;

the second HVFET further comprising:
  a second source diffusion region of the second conductivity type disposed in the substrate and spaced-apart from the second well region, a second channel region being defined between the second well region and the second source diffusion region;
  a third drain diffusion region of the second conductivity type disposed in the second well region;
  a second buried layer region of the first conductivity type disposed within the second well region;
  a second insulated gate formed over the second channel region.

2. The complementary device of claim 1 wherein the first buried layer region comprises a plurality of buried layers.

3. The complementary device of claim 2 wherein the first drain diffusion region is connected to each of the plurality of buried layers.

4. The complementary device of claim 3 wherein the second drain diffusion region is connected to each of the plurality of buried layers.

5. The complementary device of claim 1 wherein the first conductivity type is P-type and the second conductivity type is N-type.

6. The complementary device of claim 1 wherein the first drain diffusion region is doped at a slightly higher concentration relative to a doping of the first well region.

7. The complementary device of claim 1 wherein the second buried layer region is spaced-apart from the third drain diffusion region.

8. A complementary device fabricated on a substrate of a first conductivity type, comprising:
  a first HVFET, which comprises:
    a first well region of a second conductivity type, opposite to the first conductivity type, disposed in the substrate;
    a first source diffusion region of the first conductivity type disposed in the first well region;
    a first drain diffusion region of the first conductivity type disposed in the first well region spaced-apart from the first source diffusion region, a first channel region being defined in the first well region between the first source diffusion region and the first drain diffusion region;
    a second drain diffusion region of the first conductivity type disposed in the first well region spaced-apart from the first drain diffusion region;
    a first buried layer region of the first conductivity type disposed within the first well region, the first buried layer region being connected to both the first and second drain diffusion regions;
    a first insulated gate formed over the first channel region;
  a second HVFET, which comprises:
    a second well region of the second conductivity type disposed in the substrate;
    a second source diffusion region of the second conductivity type disposed in the substrate and spaced-apart from the second well region, a second channel region being defined between the second well region and the second source diffusion region;
    a third drain diffusion region of the second conductivity type disposed in the second well region;
    a second buried layer region of the first conductivity type disposed within the second well region;
  a second insulated gate formed over the second channel region.

9. The complementary device of claim 8 wherein the second well region is spaced-apart from the first well region.

10. The complementary device of claim 8 wherein the first buried layer region comprises a plurality of buried layers.

11. The complementary device of claim 10 wherein the first and second drain diffusion regions are connected to each of the plurality of buried layers.

12. The complementary device of claim 8 wherein the first conductivity type is P-type and the second conductivity type is N-type.

13. The complementary device of claim 8 wherein the second buried layer region is spaced-apart from the third drain diffusion region.

* * * * *